(12) United States Patent
Toshikiyo

(10) Patent No.: US 7,718,949 B2
(45) Date of Patent: May 18, 2010

(54) SOLID-STATE IMAGING ELEMENT AND SOLID-STATE IMAGING DEVICE

(75) Inventor: Kimiaki Toshikiyo, Osaka (JP)

(73) Assignee: Panasonic Corporation, Osaka (JP)

( * ) Notice: Subject to any disclaimer, the term of this patent is extended or adjusted under 35 U.S.C. 154(b) by 89 days.

(21) Appl. No.: 11/768,970

(22) Filed: Jun. 27, 2007

(65) Prior Publication Data

US 2008/0011937 A1    Jan. 17, 2008

(30) Foreign Application Priority Data

Jun. 30, 2006    (JP) .............................. 2006-182301

(51) Int. Cl.
*H01J 3/14*    (2006.01)
(52) U.S. Cl. ...................... 250/216; 348/340
(58) Field of Classification Search ................. 250/216, 250/208.1; 359/238; 348/340, 360
See application file for complete search history.

(56) References Cited

U.S. PATENT DOCUMENTS

| | | | |
|---|---|---|---|
| 6,927,915 B2 | 8/2005 | Nakai | |
| 2003/0044729 A1* | 3/2003 | Huang et al. | 430/321 |
| 2003/0164922 A1* | 9/2003 | Robins et al. | 349/201 |
| 2006/0028728 A1* | 2/2006 | Li | 359/573 |
| 2006/0125945 A1* | 6/2006 | Suzuki | 348/311 |
| 2006/0125948 A1* | 6/2006 | Orita et al. | 348/340 |
| 2006/0284052 A1 | 12/2006 | Toshikiyo et al. | |
| 2007/0035721 A1 | 2/2007 | Toshikiyo et al. | |
| 2007/0164329 A1 | 7/2007 | Toshikiyo | |

FOREIGN PATENT DOCUMENTS

JP    2004 020957    1/2004

OTHER PUBLICATIONS

English Language Abstract of JP 2004-020957.
Prather, "Design and application of subwavelength diffractive lenses for integration with infrared photodetectors", Optical Engineering, vol. 38 No. 5, May 1999, pp. 870-878.

* cited by examiner

*Primary Examiner*—Georgia Y Epps
*Assistant Examiner*—Kevin Wyatt
(74) *Attorney, Agent, or Firm*—Greenblum & Bernstein, P.L.C.

(57) ABSTRACT

A solid-state imaging element or the like capable of limiting an abrupt refractive index distribution and collecting incident light at high efficiency is provided. The solid-state imaging element (size: 5.6 μm square) has a distributed index lens, a G color filter, Al wiring, a signal transmitting unit, a planarizing layer, a light receiving element (Si photodiode) and a Si substrate. A concentric structure of the distributed index lens is formed of $SiO_2$ (n=1.43). This structure is a two-stage structure having film thicknesses of 1.2 and 0.8 μm. The distributed index lens is constructed by cutting concentric circular recesses into $SiO_2$ and has a planar region about the center. A medium surrounding the lens is air (n=1).

11 Claims, 17 Drawing Sheets

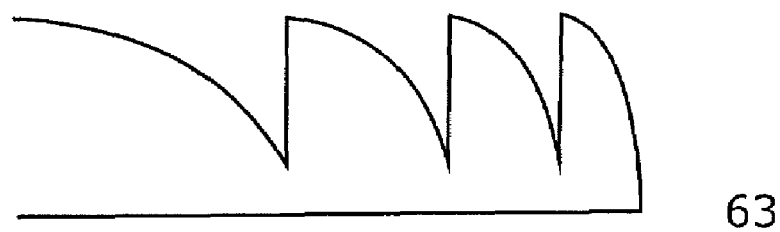
FIG. 1A
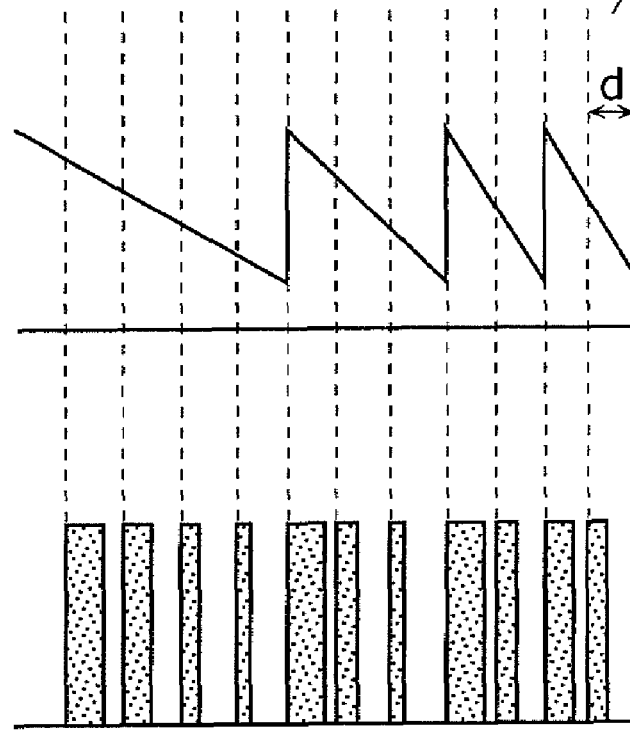
FIG. 1B
FIG. 1C

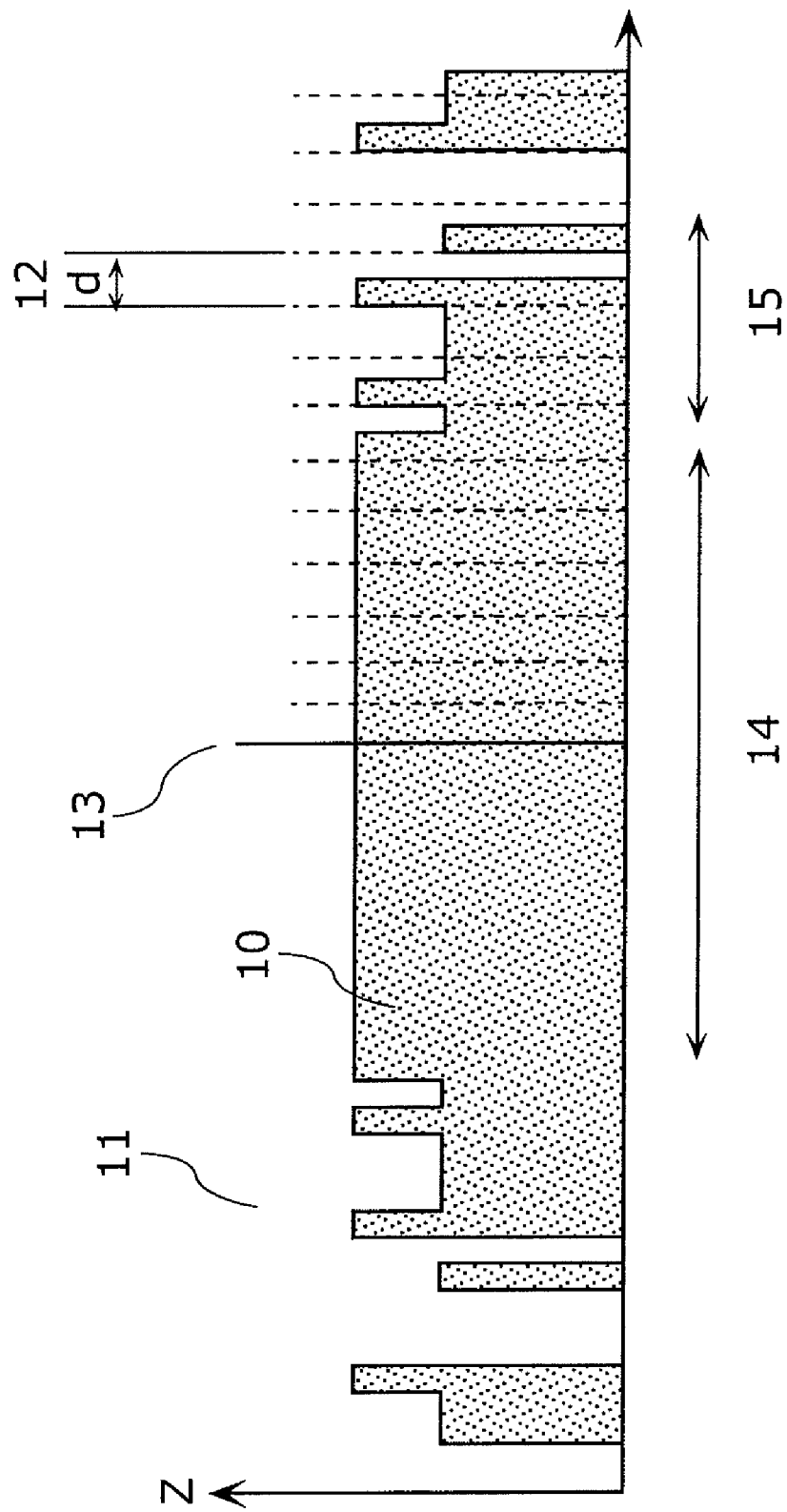

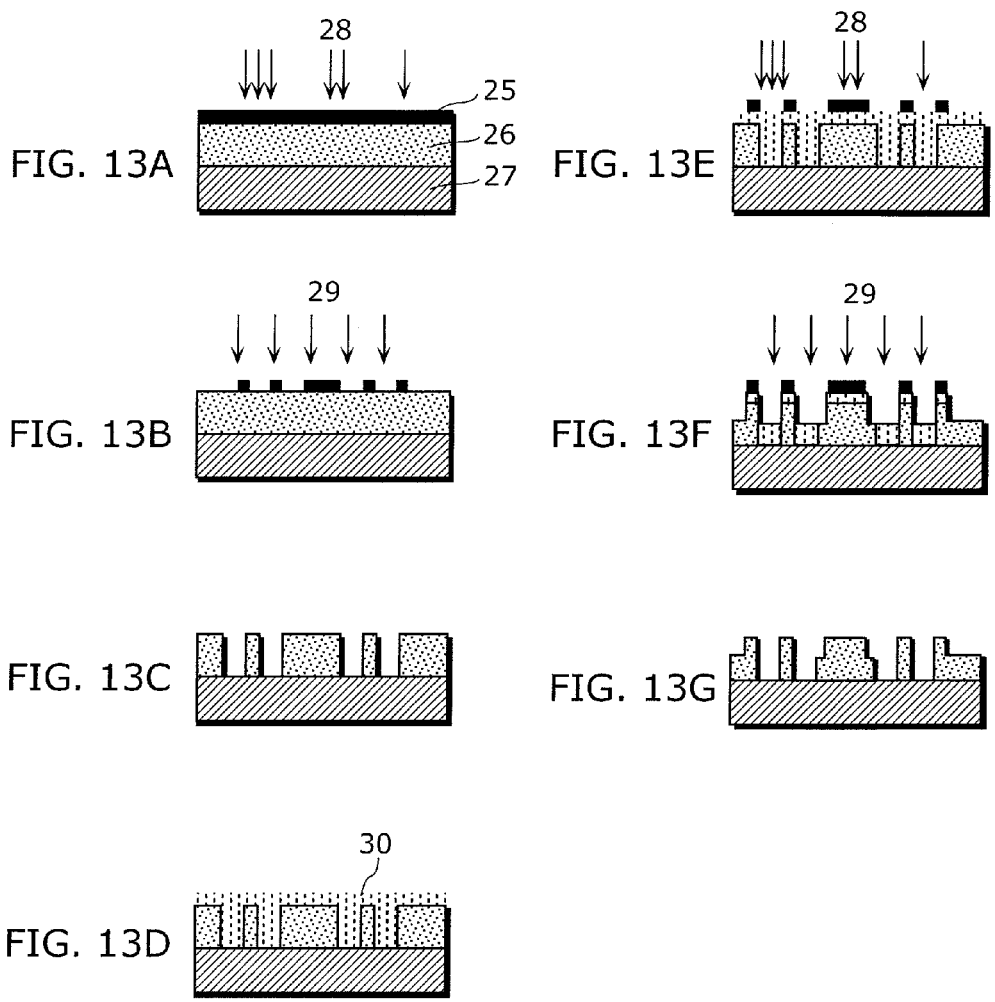

US 7,718,949 B2

SOLID-STATE IMAGING ELEMENT AND SOLID-STATE IMAGING DEVICE

BACKGROUND OF THE INVENTION (1) Field of the Invention

The present invention relates to a solid-state imaging element used in a digital camera or the like and to a solid-state imaging device.

(2) Description of the Related Art

With the widespread proliferation of digital cameras and mobile telephones with cameras in recent years, the market for solid-state imaging elements has markedly grown. Presently, in CCDs and CMOS image sensors widely used as solid-state imaging elements, semiconductor integrated circuits having plural light receiving units are two-dimensionally arrayed to convert an optical signal from an object into an electrical signal.

As a demand with respect to solid-state imaging elements, there is a demand for increasing the sensitivity as well as increasing the number of pixels and the resolution. The sensitivity of a solid-state imaging element is determined by the magnitude of an output current from a light receiving element with respect to the quantity of incident light. Therefore, introduction of incident light into the light receiving element with reliability is an important factor in improving the sensitivity.

FIG. 5 is a diagram showing an example of the structure of a conventional ordinary solid-state imaging element (pixel). Incident light 61 which perpendicularly enters a microlens 62 of a solid-state imaging element 200 is separated by a color filter 2 of red (R), green (G) or blue (B) and thereafter converted into an electrical signal by a light receiving element 6 (Si photodiode). Microlenses are used in almost all solid-state imaging elements, because relatively high light collection efficiency can be obtained by using the microlens. The solid-state imaging element 200 further has Al wiring conductors (light shielding films) 3, signal transmitting units 4 and planarizing layers 5, as shown in FIG. 5.

Solid-state imaging elements presently have an extremely fine structure such that the pixel size (also referred to as "cell size") is 2.2 μm. However, a much smaller pixel size is required for a further improvement in resolution in future. A microlens is processed on the submicron order to have such a pixel size and the microlens cannot be formed by heat reflow in the current process. Therefore, the development of a novel fine optical element with which microlenses will be replaced is indispensable to realize further improvements in sensitivity and resolution of solid-state imaging elements in future.

With the development of the planar process techniques typified by optical lithography and electron beam lithography in recent years, a light collecting element having a structure with a periodicity in a subwavelength region (subwavelength lens: SWLL) has attracted attention. "Subwavelength region" is referred to as a region of wavelengths substantially equal to or shorter than the wavelength of light to be collected. A research group at the University of Delaware has demonstrated by simulation that when a Fresnel lens which is an aspherical lens is changed into an SWLL in lattice form, it has a light collecting effect (see, for example, "D. W. Prather, Opt. Eng. 38 870-878 (1999)"). This SWLL is formed by a method of dividing a conventional Fresnel lens (FIG. 1(*a*)) by the period (width: d) of a λ/2n (λ: the wavelength of incident light, n: the refractive index of the lens material) region 63 and performing linear approximation (FIG. 1(*b*)) and approximation to the rectangular shape (FIG. 1(*c*)) in each region. It has also been reported that a blazed binary optical diffraction element was formed by controlling the line width of the structure in a sub-wavelength region, and that the diffraction efficiency was thereby improved (see, for example, Japanese Unexamined Patent Application Publication No. 2004-20957).

If a SWLL can be used as a light collecting element for a solid-state imaging element, a microlens can be formed by the ordinary semiconductor process and the shape of the lens can be freely controlled.

FIG. 2 shows a basic structure of a solid-state imaging element incorporating a SWLL-type light collecting element 1. In FIG. 2 is illustrated a state in which a SWLL having a submicron fine projection/recess structure is on-chip-mounted in place of a microlens. The film thickness (height) of the light collecting element 1 is 0.5 μm.

FIG. 3 is a top view of the SWLL-type light collecting element 1. The concentric circle structure in the light collecting element 1 is formed of a high-refractive-index material 65 ($TiO_2$ (n=2.53)) and a low-refractive-index material 66 (air (n=1.0)), and the period 63 between adjacent circular light-transmitting films is 0.2 μm.

The line width in the concentric circle structure of the light collecting element 1 has the maximum value at a central portion of the circle and inner to outer rings are successively reduced in line width. When the period is substantially equal to or shorter than the wavelength of incident light, the effective refractive index that affects light is determined by the ratio of the volumes of the high-refractive-index material and the low-refractive-index material. A lens having this structure is a distributed index lens in which the effective refractive index is reduced along a direction from the center of concentric circles to the outer periphery. The division period (e.g., the region 63 in FIGS. 1A to 1C) of this SWLL depends strongly on the wavelength of target incident light and is, therefore, about 0.1 to 0.3 μm in the visible light region.

The above-described conventional method requires making the structure finer (0.01 to 0.1 μm) in this region. However, the period of even the finest structure obtained by the current process techniques is limited to about 0.07 μm.

FIG. 4 shows a light collecting profile of the SWLL. The direction in which incident light travels corresponds to the direction from the bottom to the top of FIG. 4. The incident light perpendicularly enters the lens. A light component 60 scattered at the lens surface can be recognized as well as light component 59 which is being effectively collected. This is due to the fact that an abrupt change in refractive index cannot be realized because of the large structure of the light collecting element 1.

SUMMARY OF THE INVENTION

An object of the present invention is to provide a solid-state imaging element or the like having a light collecting element capable of limiting an abrupt refractive index distribution and collecting incident light at high efficiency.

In the present invention, a light collecting element capable of limiting an abrupt refractive index distribution and collecting incident light at high efficiency has been devised. The light collecting element according to the present invention, described below in detail, is a lens in which incident light components are separated into a parallel light component and a convergent light component, and in which the proportion of the convergent light component is reduced. In this way, the quantity of light transmitted through the fine structure can be limited to reduce a light collection loss and a scattering loss. In a solid-state imaging element having the light collecting element, it is not necessary to collect incident light on a point;

incident light may be collected on the entire surface of the formation region of a light receiving element.

In order to solve the above problem, the solid-state imaging element according to the present invention includes a light collecting element. The light collecting element includes: zone regions of plural light transmitting films in a concentric structure, which are divided by the line width substantially equal to or shorter than the wavelength of incident light; and a planar region at the center of the concentric structure of the light collecting element having a diameter which is substantially equal to or larger than the wavelength of the incident light. This makes it possible to limit the quantity of light transmitted through the fine structure of the light collecting element and to reduce a light collection loss and a scattering loss.

In addition, the planar region in the light collecting device may have a constant refractive index produced by a light transmitting film which is uniformly formed, and the zone region may have an effective refractive index distribution produced by a light transmitting film which is partially formed. An abrupt change in refractive index is thereby avoided and a highly efficient light collecting element can be realized.

In addition, in the solid-state imaging element, phase modulation caused by a refractive index distribution in the zone regions is divided by a product of $2\pi$ and a natural number except zero. This makes it possible to increase phase modulation of incident light. The degree of freedom in lens design is thereby increased.

In addition, in the solid-state imaging element, a boundary corresponding to $2\pi$ of phase modulation caused by a refractive index distribution in the zone regions abuts on a single side or plural sides of a pixel. This enables incident light to reach the light receiving element without being attenuated by the light shielding film in the solid-state imaging element, thus improving the sensitivity of the sensor.

In addition, in the solid-state imaging element, a boundary corresponding to $2\pi$ of phase modulation caused by a refractive index distribution in the zone regions contains a pixel region. This makes it possible to limit the quantity of light transmitted through the fine structure of the light collecting element and to reduce a light collection loss and a scattering loss.

In addition, in the solid-state imaging element, the position of the center of the concentric structure in the light collecting element differs from the position of the center of the solid-state imaging element. This enables oblique incident light to reach the light receiving element with improved efficiency and realizes a solid-state imaging element having improved oblique incidence characteristics.

In addition, in the solid-state imaging element, a multilayer film structure having an optical antireflection effect produced by a difference in refractive index is formed on the planar region of the light transmitting film. Reflection on the lens surface is thereby reduced to improve the sensitivity.

In addition, in the solid-state imaging element, the structure of the light collecting element is a multilayer film structure having an optical antireflection effect produced by a difference in refractive index. The lens itself is made as an antireflection film. It is, therefore, possible to reduce the number of process steps as well as to reduce the production cost.

In addition, in the solid-state imaging element, the structure of the light collecting element is a dielectric multilayer film structure having a color separating function. This makes it possible to perform collection of light and color separation. It is, therefore, possible to reduce the size and thickness of the solid-state imaging element.

Furthermore, a solid-state imaging device according to the present invention includes solid-state imaging elements arranged in a two-dimensional array, each of which has a light collecting element and a light receiving element. The light collecting element includes: zone regions of plural light transmitting films in a concentric structure, which are divided by the line width substantially equal to or shorter than the wavelength of incident light; and a planar region at the center of the light collecting element. The diameter of the planar region is substantially equal to or larger than the wavelength of the incident light. The solid-state imaging devices positioned at the center of the solid-state imaging device is formed so that the center axis of the light receiving element and the center axis of the light collecting element coincide with each other, and the solid-state imaging elements positioned on the periphery of the solid-state imaging device is formed so that the center of the light collecting element is close, compared to the light receiving element, to the center of the solid-state imaging device. This enables oblique incident light to reach the light receiving element with improved efficiency and realizes a solid-state imaging element having improved oblique incidence characteristics.

In addition, in the solid-state imaging device, the planar region of the light transmitting film in the second light collecting element positioned on the periphery of the solid-state imaging device is smaller than the planar region of the light transmitting film in the first light collecting element positioned at the center of the solid-state imaging device, and the number of the zone regions in the second light collecting element is larger than the number of the zone regions in the first light collecting element. The sensitivity of peripheral pixels is thereby increased, so that the shading characteristics can be improved.

The solid-state imaging element of the present invention has the above-described lens structure and is capable of improving the resolution and sensitivity and making the manufacturing process easier to perform.

FURTHER INFORMATION ABOUT TECHNICAL BACKGROUND TO THIS APPLICATION

The disclosure of Japanese Patent Application No. 2006-182301 filed on Jun. 30, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIGS. 1A to 1C each is a diagram showing in section the structure of a conventional sub-wavelength lens;

FIG. 7 is a diagram showing in section the structure of a distributed index lens in the first embodiment of the present invention;

FIGS. 13A to 13G each is a diagram showing the process of making the distributed index lens in the first embodiment of the present invention;

DESCRIPTION OF THE PREFERRED EMBODIMENT(S)

Embodiments of the present invention will be described in detail with reference to the drawings. The description of embodiments with reference to the accompanying drawings will be made below for illustration purpose without any intention to limit the invention to the embodiments.

First Embodiment

Figure 6:
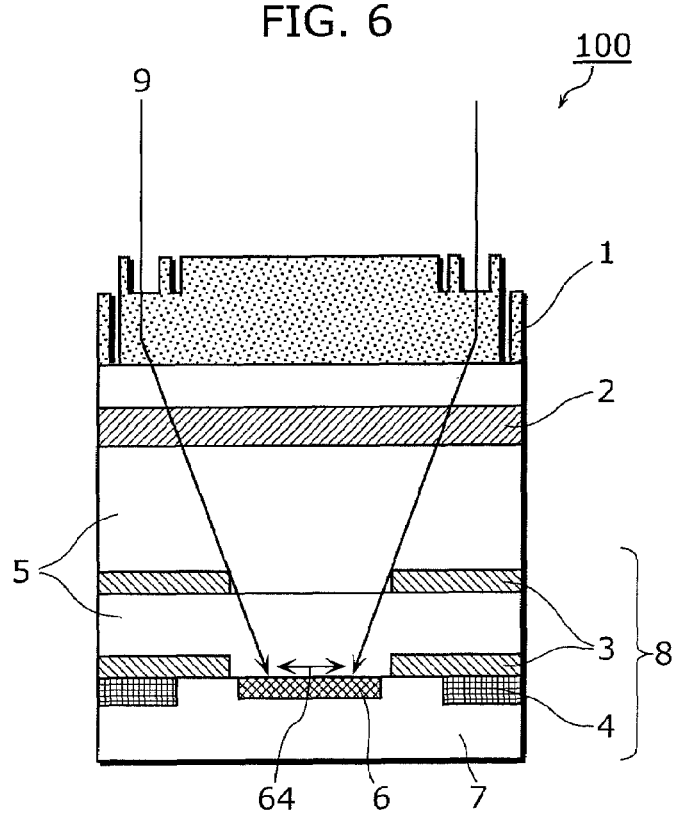
FIG. 6 is a diagram showing a basic structure for one pixel in a first embodiment of the present invention.

FIG. 6 shows a basic structure of a solid-state imaging element as one embodiment of the present invention. The solid-state imaging element (also referred to as "pixel") 100 shown in FIGS. 1A to 1C is provided in a 5.6×5.6 μm size and has a distributed index lens 1, a color filter 2 (for transmitting green (G) light for example), Al wiring conductors 3, signal transmitting units 4, planarizing layers 5, a light receiving element (Si photodiode) 6 and a Si substrate 7.

FIG. 7 is a sectional view of a light collecting element (i.e., a distributed index lens 1) according to this embodiment. The concentric circle structure of the light collecting element is formed of $SiO_2$ (n=1.43) and has a two-step structure of 1.2 μm-thick and 0.8 μm-thick films. The light collecting element according to this embodiment is constructed by cutting $SiO_2$ to form concentric circular recesses. The medium surrounding the light collecting element is air (n=1).

In general, a distributed index lens is designed so that the refractive index is maximized at an optical center of the lens. In this embodiment, $SiO_2$ accumulates densely in the vicinity of a lens optical center 13 and the density of $SiO_2$ is changed so as to be lower at one ring than at the adjacent inner ring. When a zone region 12 is substantially equal to or smaller than the wavelength of incident light, the effective refractive index that affects light is determined by the ratio of the volumes of a high-refractive-index material ($SiO_2$ in this embodiment) and a low-refractive-index material (air) in the region. That is, when the high-refractive-index material in the zone region is increased, the effective refractive index becomes higher. When the high-refractive-index material in the zone region is reduced, the effective refractive index becomes lower.

The size of a disk region 14 at the center of the lens is substantially equal to or larger than the incident light wavelength and the refractive index of the lens material for light is uniform.

Figures 8A, 8B, 8C, 8D, 8E, 8F:
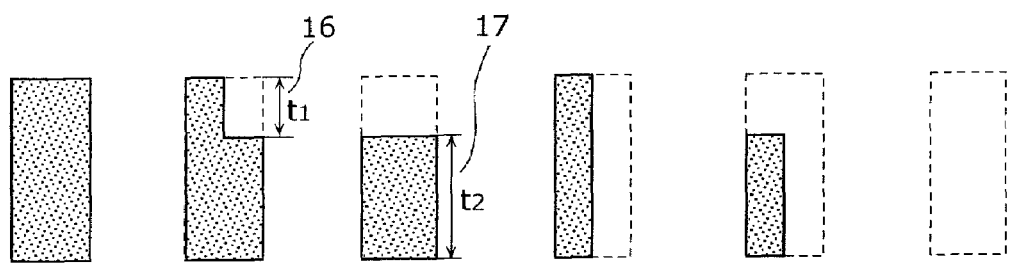
FIGS. 8A to 8F each is a diagram showing a basic structure constituting the distributed index lens in the first embodiment of the present invention.

FIGS. 8A to 8F are diagrams showing six basic structures in forming the light collecting element having the two-step concentric structure. FIG. 8A shows the densest structure, that is, the structure having a high effective refractive index. The structures shown in FIGS. 8B to 8F have lower refractive indices in this order. The upper-stage (light entrance side) film thickness 16 and the lower-stage (substrate side) film thickness 17 are 0.4 μm and 0.8 μm, respectively, and the ratio of these film thicknesses (upper stage/lower stage) is 0.5. The amount of change in refractive index can be changed by changing the film thickness ratio. For example, when the film thickness ratio is made higher, the high-refractive-index material greatly decreases in volume due to changes in the basic structure (A to F) and, accordingly, the refractive index in the regions where the effective refractive index is higher is reduced greatly. Conversely, when the film thickness ratio is made lower, the high-refractive-index material lightly decreases in volume due to changes in the basic structure (A to F) and, accordingly, the refractive index in the regions where the effective refractive index is lower is reduced greatly.

For ease of explanation, this embodiment has been described with respect to an example of the configuration of a light collecting element based on basic structures such as shown in FIG. 8. Needless to say, a light collecting element may be configured by using other basic structures. For example, when the structures shown in FIGS. 8C and 8B are combined, a projecting configuration is formed. When the structures shown in FIGS. 8B and 8D are combined, a recessed structure is formed. When these structures are used as a basic structure in a region of a size substantially equal to half of the wavelength of incident light, the same light collecting characteristics can be obtained.

The most significant advantage of the structure of the light collecting element according to this embodiment resides in that refractive index distribution can be freely controlled only by changing the combination of basic structures. The change in refractive index of the light collecting element in the present invention is as indicated by a solid line in FIG. 9. The refractive index of the lens is highest at the center of the concentric circles and is reduced in order of the inner to outer end concentric circles. A parabolic curve (zone region group 15) represents a refractive index distribution for collecting incident light of a wavelength λ (550 nm) over a focal length f (7.0 μm), expressed by the following equation.

$$\Delta n(x) = \Delta n \max \{[A(x^2-r^2)+B(x-r)\sin\theta]/2\pi+C\} \quad (1)$$

(A, B and C: Constants)

In this equation, Δn max is the difference between the refractive indices of the entrance-side medium and the lens material (1.43 in this example), and r is the boundary position (the distance from the lens optical center) of the first Fresnel zone. Also, when the refractive index of the entrance-side medium is $n_0$ and the refractive index of the exit-side medium is $n_1$, parameters shown by the following equations:

$$A=-(k_0 n_1)/2f$$

$$B=-k_0 n_0$$

$$k_0=2\pi/\lambda$$

can be set in the above equation (1). Through this setting, the lens can be optimized for each wavelength with respect to focal lengths and incidence angles and wavelengths of the current incident light selected according to purposes. In the above equation (1), the term defined by a quadratic function of the distance x from the pixel center represents collected light components and the term defined by the product of x and the trigonometric function represents polarized components.

Needless to say, the parabolic line expressed by the above equation (1) is continuous and indicates an ideal refractive index distribution. In actual fine optical systems (in the submicron region), however, it is extremely difficult to form a continuous distribution, and the load of forming such a distribution in the manufacturing process is considerably large. The present invention has succeeded in obtaining the same effect by discretizing the refractive index distribution in a region equal to or smaller than the half of the incident light wavelength.

Figure 10:
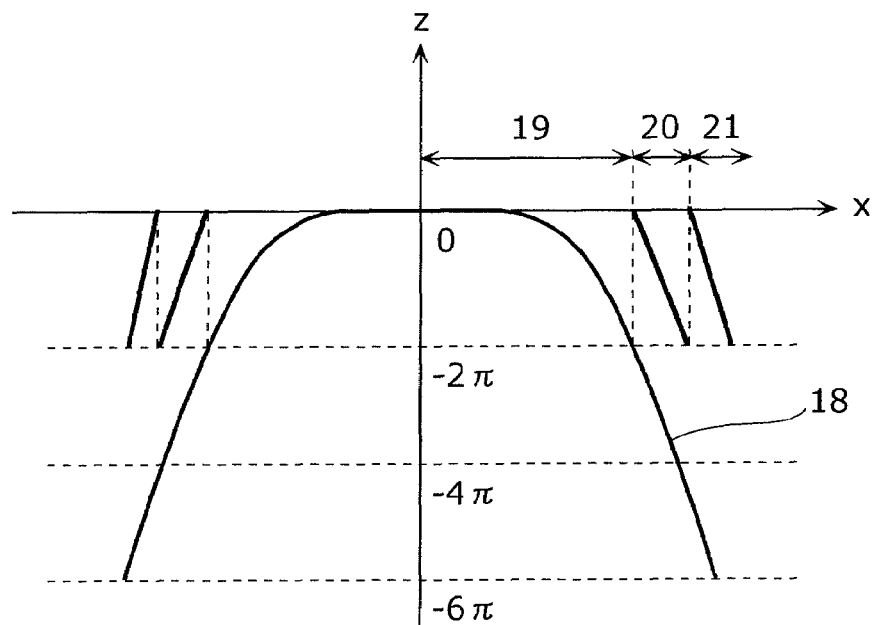
FIG. 10 is a diagram showing phase modulation of light in the first embodiment of the present invention.

FIG. 10 is a diagram showing a case where the refractive index distribution is sampled in equal period. This enables the line widths of the basic structures to be made constant and enables the process conditions (lithography, etching and so on) for the pixels to be equalized, thus making the process easier and improving the accuracy of the process.

In this embodiment, incident light is phase-modulated by a refractive index distribution to control the direction of propagation of light. As shown in FIG. 10, phase modulation shown by the above equation (1) is discontinuous phase modulation, as in the second Fresnel zone 20 and the third Fresnel zone 21, as well as in the first Fresnel zone 19, defined by division of the above equation (1) by 2π. However, effective phase modulation is equivalent to continuous phase modulation 18 because each Fresnel zone is made distinct from others in correspondence with one phase.

As the second advantage of the present invention, the reinforcement of the light collecting effect produced by the refractive index distribution using a film thickness distribution can be mentioned. In general, diffraction optics relating to structures larger than wavelengths can be systematized by Fourier optics, while diffraction optics relating to structures smaller than wavelengths can be systematized by the effective refractive index method. In the case of diffraction optics relating to structures larger than wavelengths, light can be treated as rays. In the case of diffraction optics relating to structures smaller than wavelengths, light can be treated as an electromagnetic field. A resonance region is positioned between the above-described two regions, and both behaviors of light as rays and an electromagnetic field are permitted in the region.

In the lens structure of the present invention, the width of the zone region is set to about λ/2n, and the zone region is located in the resonance region. In this region, both the refractive index of the material itself and the refractive index averaged according to the structure (effective refractive index) affect incident light. As a result, the lens structure has the light collecting characteristics of both a lens of refractive index distribution type and a lens of film thickness distribution type and has a light collection efficiency higher than that of the conventional refractive-index-distribution-type lens.

Figure 11:
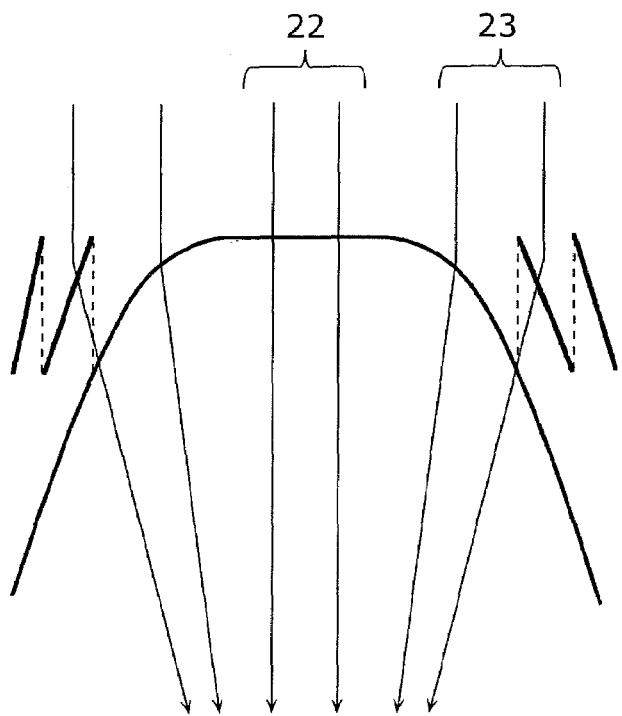
FIG. 11 is a diagram showing light collecting characteristics of the lens in the first embodiment of the present invention.

FIG. 11 is a diagram showing light collecting characteristics of the light collecting element according to this embodiment. Light 22 incident on the disk region at the center of the lens (i.e., the planar region) propagates as parallel light without being deflected. On the other hand, the direction of propagation of light 23 incident on the zone region group (i.e., the region on the periphery of the disk region) is deflected by the refractive index distribution and the light converges on the optical axis of the lens (the light is collected).

Let the distance between the lens and the light receiving unit be D and the cell size be ( ). When the unit pixel structure of the solid-state imaging element satisfies $$n_1(1-a)(\Phi^2-2\Phi_{PD})/8\lambda < D < n_1\Phi^2(1-a)/8\lambda \quad (2)$$

the light collection efficiency is improved because the planar region exists at the center of the lens. In this expression, $\Phi_{PD}$ is the width of the light receiving region and a is the ratio of the collected light spot diameter 64 to the cell size.

Figure 12A:
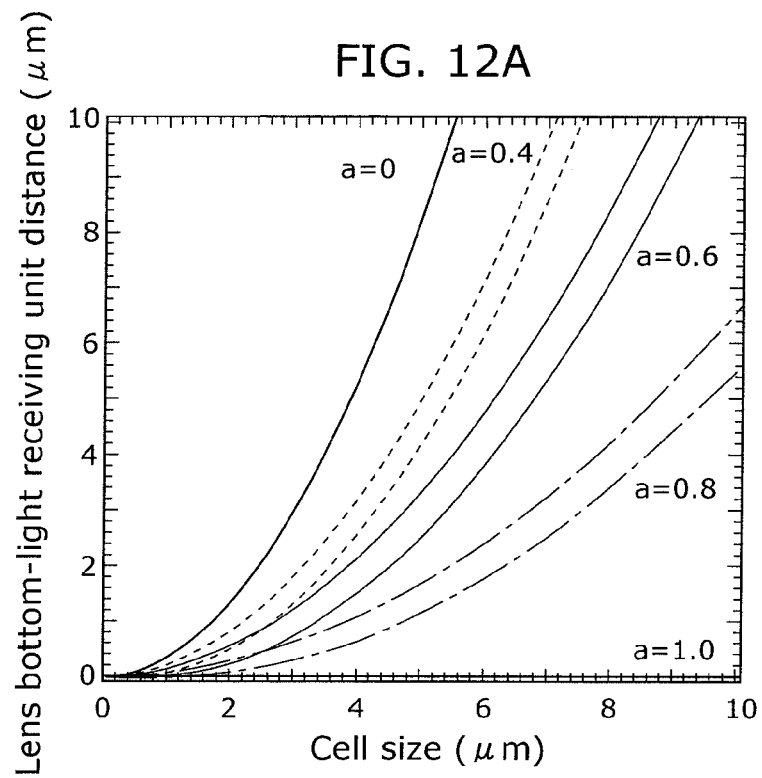
FIGS. 12A and 12B each is a diagram showing propagation of light in the pixel in the first embodiment of the present invention.

FIG. 12A shows the relationship between the lens-light receiving unit distance D and the cell size Φ (incident light wavelength: 0.55 μm). While in this embodiment calculation is performed by assuming that $\Phi_{PD}=aD$ for description, the lens is designed so that $\Phi_{PD}>aD$ in actuality. At each spot diameter, the region shown by the above equation (2) indicates a quadratic curve in band form. As is apparent from FIG. 12A, an improvement in light collection efficiency of a solid-state imaging element having a cell size of about 5.5 to 7.0 μm is expected in a case where the pixel structure is such that D is about 5 μm and $\Phi_{PD}$ is about 3 μm.

Figure 12B:
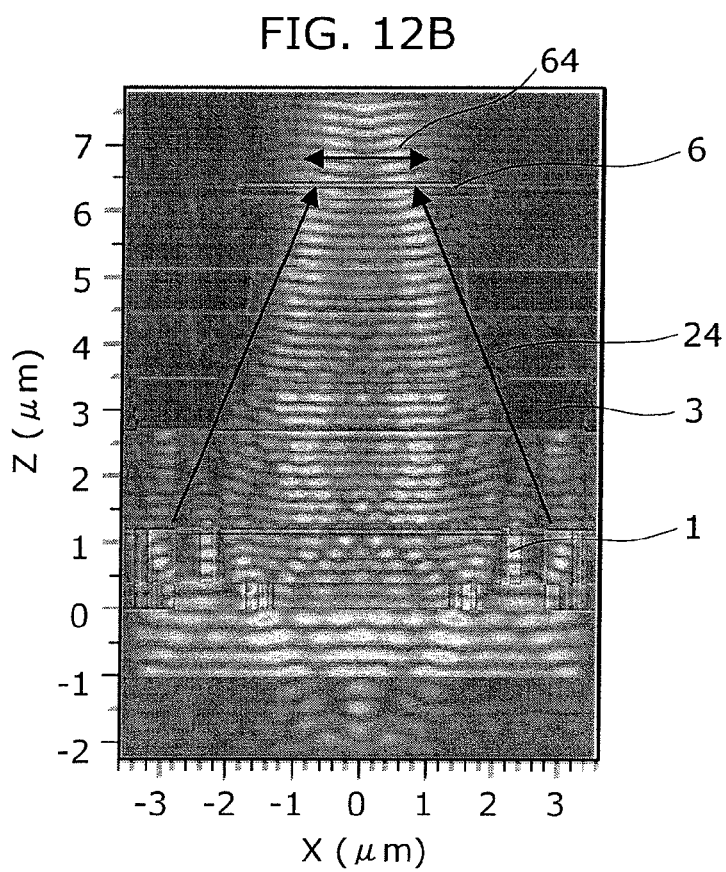

FIG. 12B shows a profile of light propagation in the unit pixel. The cell size is 5.6 μm; the incident light wavelength is 0.55 μm; the lens-light receiving unit distance is 5.4 μm; and the aperture ratio a=0.4. The structural conditions satisfy the above equation (2).

Figure 2:
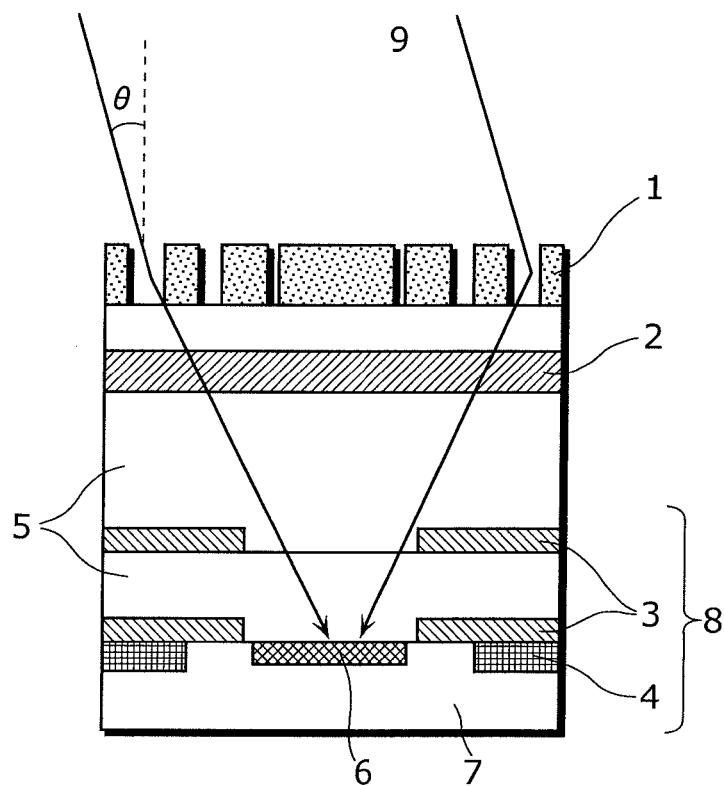
FIG. 2 is a diagram showing a basic structure of a conventional solid-state imaging element incorporating a SWLL.
Figure 3:
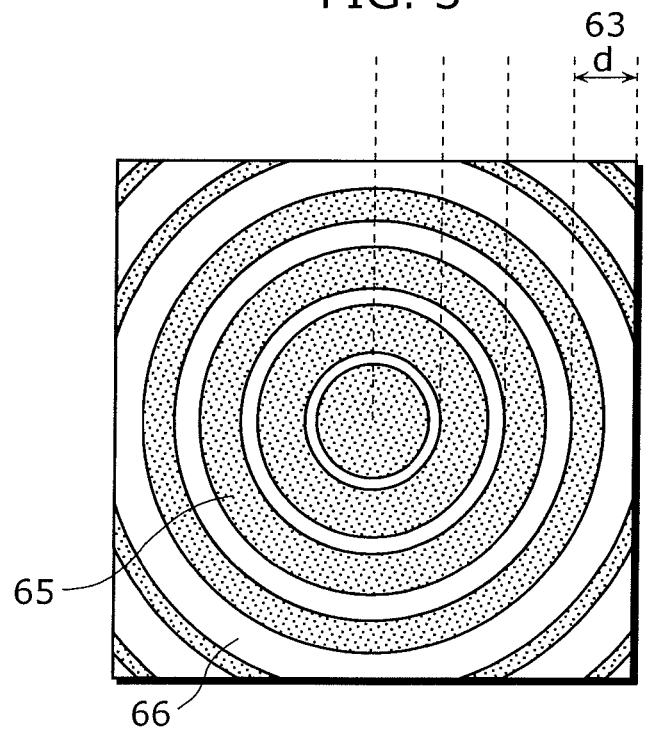
FIG. 3 is a top view of the conventional solid-state imaging element incorporating a SWLL.
Figure 4:
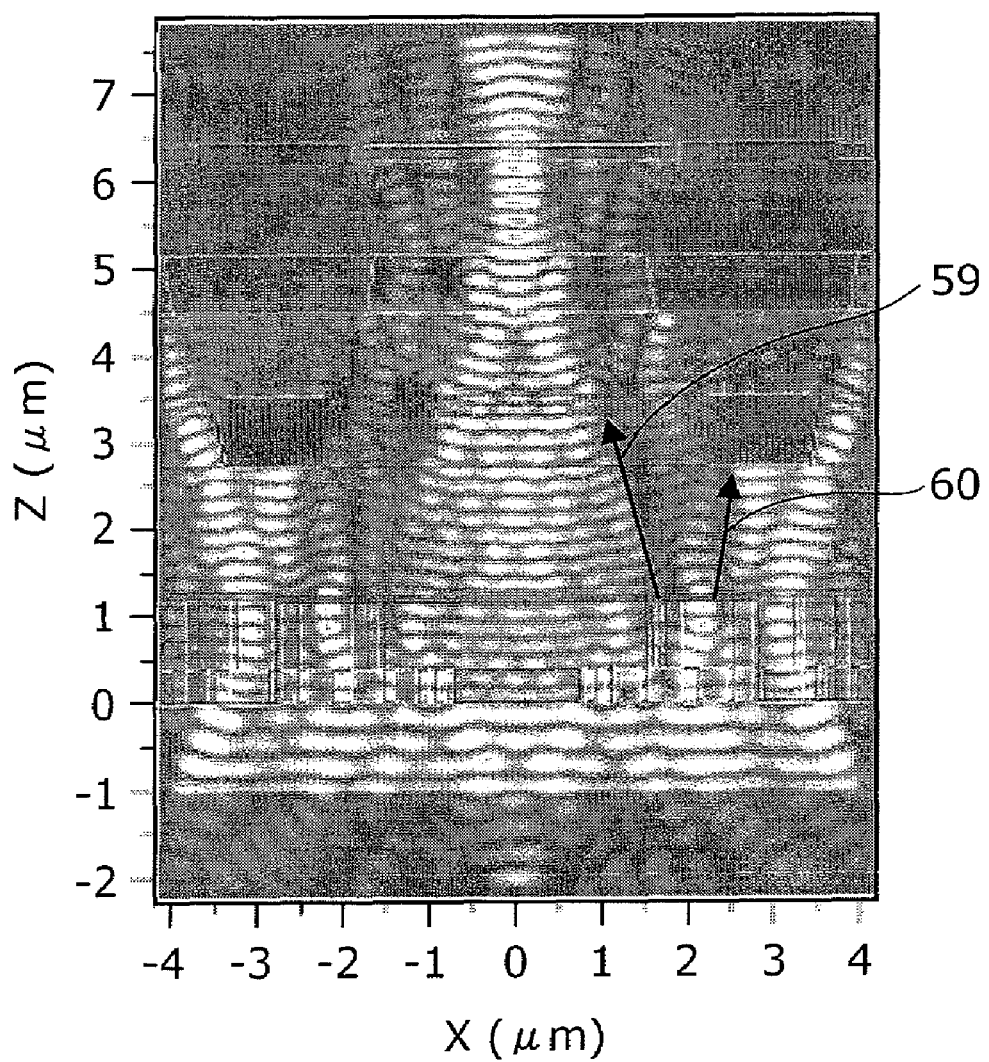
FIG. 4 is a diagram showing the state of propagation of light through the conventional sub-wavelength lens.
Figure 5:
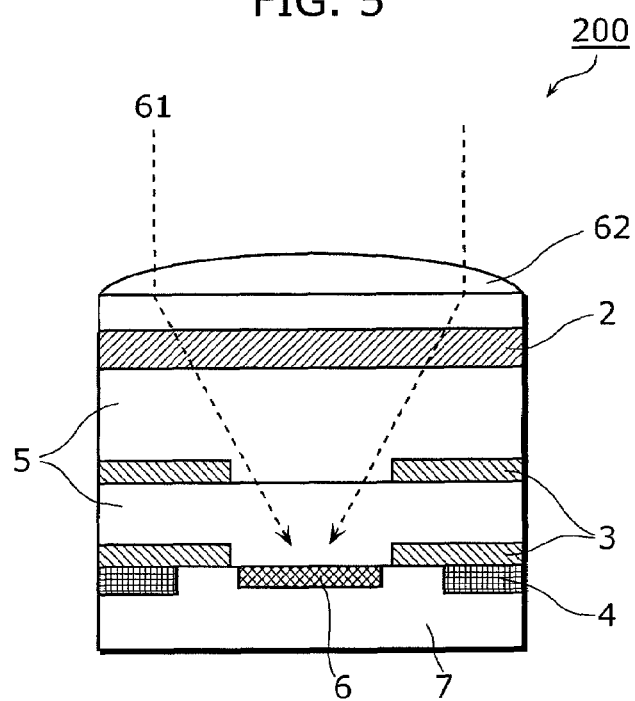
FIG. 5 is a diagram showing an example of a structure of an ordinary conventional solid-state imaging element (pixel)

It can be understood that light perpendicularly incident on the lens 1 as shown in FIG. 12B separates into parallel light and convergent light to enter the entire region of the light receiving element 6. When traveling in this way, the light is collected efficiently without being attenuated by the shielding films 3 (see the profile in the vicinity of oblique arrows in FIG. 12B). It can also be recognized that the light collection loss and scattering loss in the zone region are smaller than those in the case shown in FIG. 4.

FIGS. 13A to 13G each is a diagram showing the process of making the distributed index lens. The lens was provided in a two-stage structure. The lens was formed by photolithography and etching performed two times. A semiconductor integrated circuit 27 constituted by a light receiving element, wiring conductors, light shielding layers, signal transmitting units and a color filter (not illustrated in FIGS. 13A to 13G) is first formed on a Si substrate using a normal semiconductor process. The size of one pixel is 5.6 µm square, and the size of the light receiving unit is 3.5 µm square. A SiO$_2$ film 26 is then formed by using a CVD apparatus and a resist 25 is applied on the SiO$_2$ film 26 (FIG. 13A). Light exposure 28 is then performed for patterning (FIG. 13B). The thicknesses of the SiO$_2$ film and the resist are 1.2 µm and 0.5 µm, respectively. After development is performed, etching 29 is performed to form a fine structure in the pixel surface (FIG. 13C). The resist 25 is removed and then bark 30 is embedded for planarizing (FIG. 13D). Resist 25 is applied and light exposure 28 is again performed for patterning (FIG. 13E). After etching (FIG. 13F), the resist 25 and bark 30 are removed, thus forming the lens of the present invention (FIG. 13G).

While in this embodiment a lens of a two-stage structure was formed on a trail basis, a lens of a further increased number of stages can be formed by using process steps including a combination of photolithography and etching shown in FIGS. 13A to 13G. When the number of stages is increased, the number of gradation steps of the refractive index distribution is increased and thus the light collection efficiency is improved.

Lenses in embodiments described below are also formed by using the above-described process steps.

Second Embodiment

Figure 14:
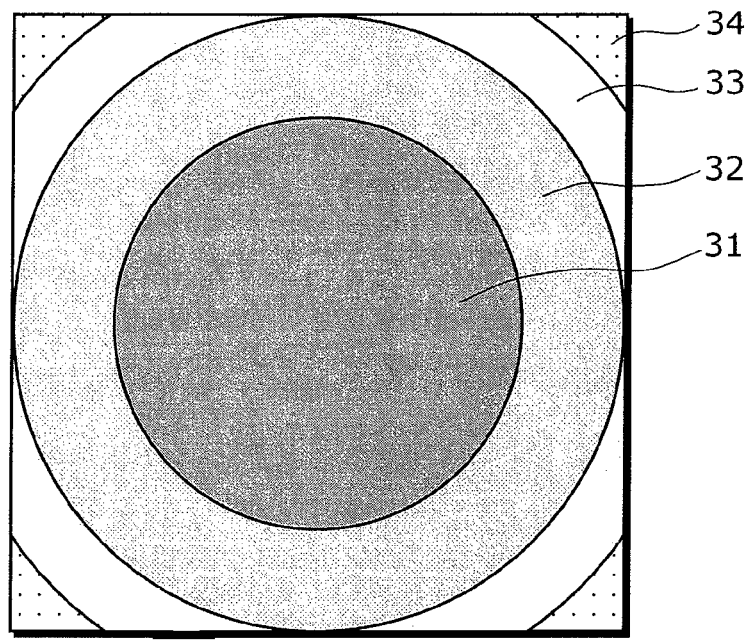
FIG. 14 is a diagram showing a zone layout of a distributed index lens in a second embodiment of the present invention.

FIG. 14 is a diagram showing a Fresnel zone layout (top view) in a unit pixel of a solid-state imaging element using VGA (310,000 pixels) according to a second embodiment of the present invention. With respect to 0° incident light, the pixel center and the lens optical center coincide with each other. A disk region 31, a zone region group 32 (corresponding to the first Fresnel zone), a zone region group 33 (corresponding to the second Fresnel zone) and a zone region group 34 (corresponding to the third Fresnel zone) are placed from the pixel center to the periphery. A feature of the layout according to this embodiment resides in that the boundary between the first Fresnel zone and the second Fresnel zone abuts on the sides of the unit pixel. In this way, the fine structure region which can act as a cause of occurrence of a light collection loss can be reduced, so that an improvement in light collection efficiency and an increase in sensitivity can be expected.

Figure 15:
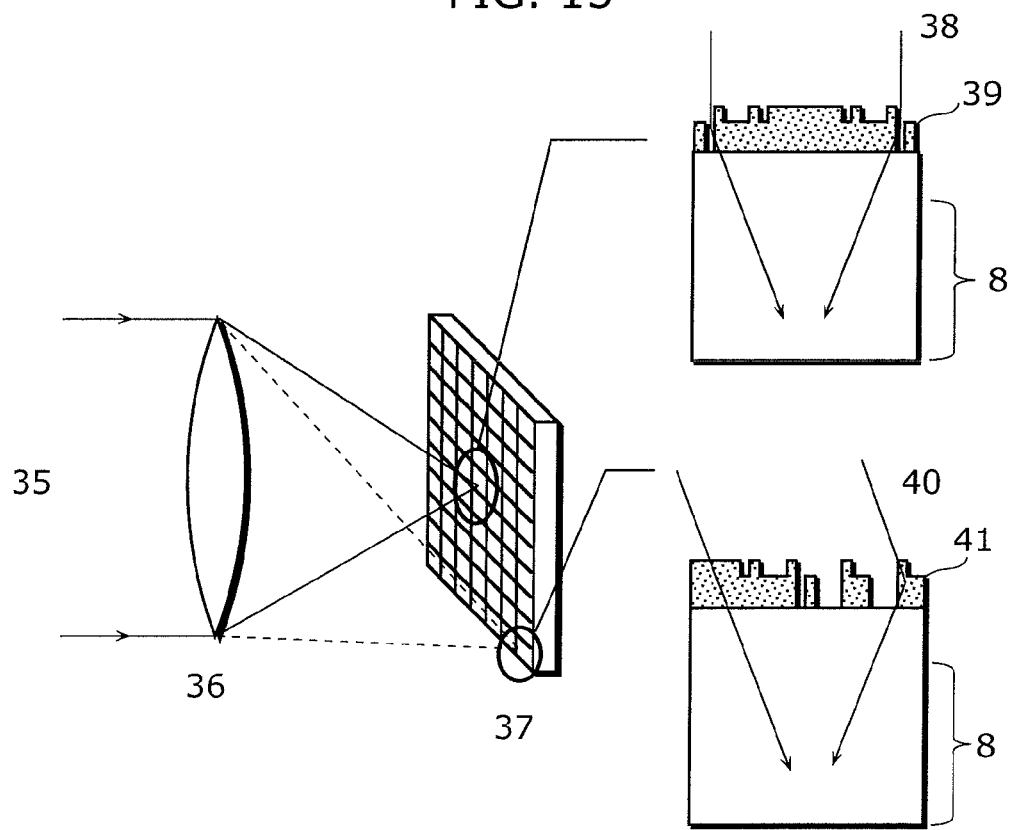
FIG. 15 is a diagram showing an array of pixels of a solid-state imaging element in the second embodiment of the present invention.

FIG. 15 is a diagram showing the array of pixels of a solid-state imaging element in this embodiment. Signal light 35 is collected by an optical lens 36 to strike the surface of a solid-state imaging element 37 having the lens. In a semiconductor integrated circuit 8 constituted by a light receiving element, wiring conductors and so on and the solid-state imaging element in which distributed index lenses are two-dimensionally arrayed, the angle of incidence of light on some of the pixels at the center and the angle of incidence of light on some of the pixels on the periphery are different from each other. While incidence 38 at approximately 0° occurs on a central portion, incidence 40 at about 30° occurs on a peripheral portion. In this embodiment, therefore, distributed index lenses respectively corresponding to the strongest incident light components incident on the pixels were formed from the center to the peripheral portion of the imaging element. The lens structure of each lens is optimized according to the position of the corresponding pixel on the imaging element so that the light collection efficiency is maximized. While the center of concentric circles is at the center of the pixels in a distributed index lens 39 for 0° incident light, the center of a distributed index lens 41 for a large-angle incident light is shifted toward the light-entrance side in correspondence with the increase in incident angle.

The amount of this shift is expressed by a trigonometric function as shown in equation (1). The quadratic curve of the refractive index distribution is shifted toward the center of the solid-state imaging element with the increase in incident angle θ.

Also, as is apparent from the relationship between the parameters A, B, and K$_0$ in the above equation (1), phase modulation varies depending on the wavelength of light to be received. This means that a lens structure optimum for the color of light incident on each pixel is provided. In this embodiment, it is known that a high light collection efficiency of approximately 80% for each of wavelengths of 0.45, 0.55 and 0.65 µm of light is exhibited when light of the wavelengths are incident on the pixels having the lens structures for the corresponding colors.

Figure 16:
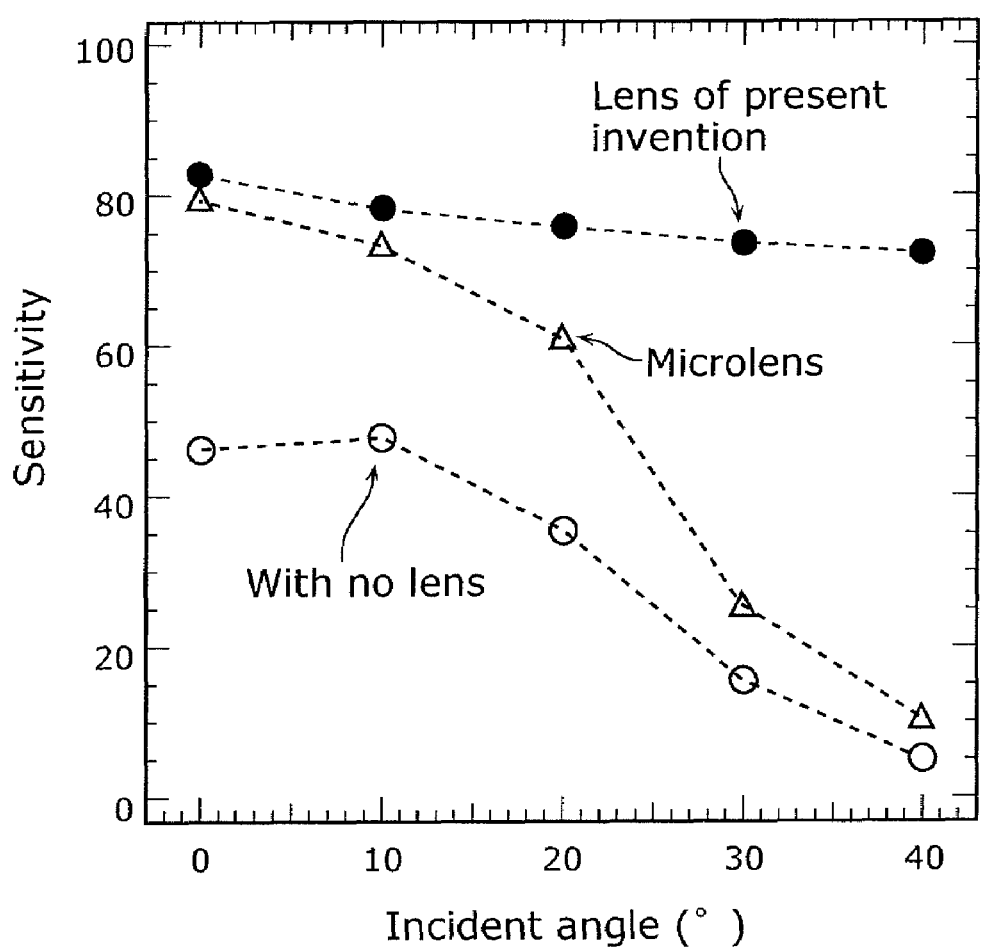
FIG. 16 is a diagram showing the light collecting efficiency of the solid-state imaging element in the second embodiment of the present invention.

FIG. 16 shows the angle dependence of the light collection efficiency. The angle on the abscissa represents the angle of incidence of light on the solid-state imaging element. In FIG. 16, 0° designates the center and an angle of 30° or more designates a peripheral pixel. With the increase in incident angle, the sensitivity of the solid-state imaging element using microlenses decreases monotonously. In contrast, the sensitivity of the distributed index lens of the present invention does not substantially decrease even in peripheral pixels. Further, the sensitivity of the distributed index lens is seven times higher than the sensitivity of the microlens in a region where the incident angle is about 40°.

It can be understood that, as is also apparent from FIG. 16, the light collecting efficiency of the distributed index lens of the present invention hardly depends on the angle of incident light in comparison with the microlens and, therefore, capable of limiting the reduction in light collection efficiency with the increase in incident angle. Therefore, an application of the present invention to a short-focal-length optical system such as one used in mobile telephone cameras can be expected.

Also, the shading effect resulting from use of a nonlinear spherical lens as an image taking lens can be reduced by using the lens of the present invention. In the case where light is collected by an aspherical lens, the incident angle with respect to pixels is increased not linearly but curvedly from the element center to the periphery. In the current microlens, it is difficult to optimize the shape of each pixel and, therefore, this angular characteristic cannot be followed. When the distributed index lens of the present invention is used, an increase in the degree of freedom with which an image taking lens is designed and an improvement in facility with which the lens is processed can be achieved; thus a reduction in the cost of production of the lens as an optical module can be expected.

Third Embodiment

Figure 17:
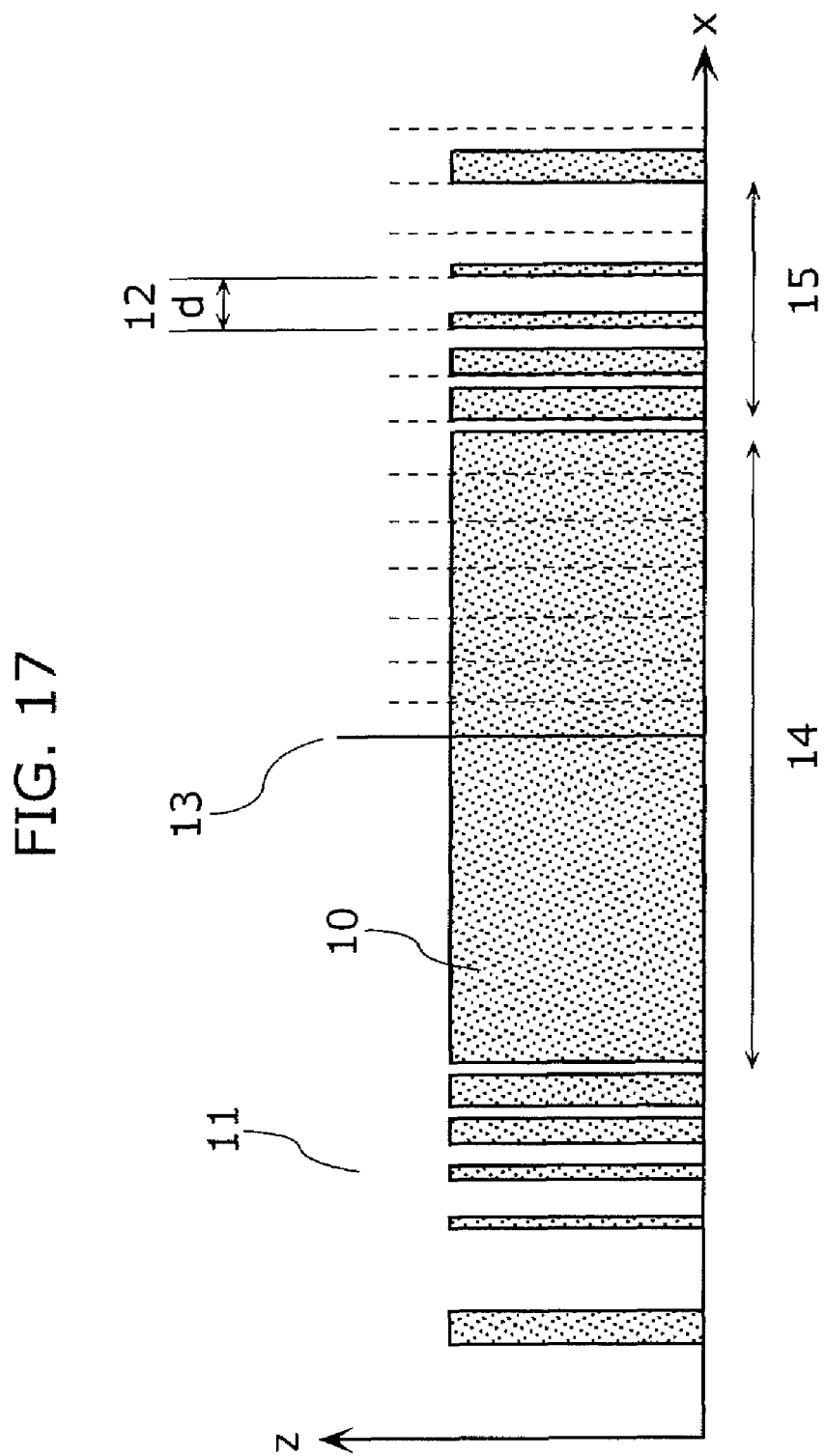
FIG. 17 is a diagram showing a zone layout of a distributed index lens in a third embodiment of the present invention.

FIG. 17 is a sectional view of a single-layer lens according to a third embodiment of the present invention. In the lens of the present invention, the refractive index distribution is controlled by changing the ratio of volumes of a high-refractive-index material and a low-refractive-index material in a zone region, as described above. Therefore, a lens capable of continuously changing the volume ratio in the zone region 12 has higher refractive index distribution controllability. From the viewpoint of process, it is difficult to form a single lens. However, a single lens is capable of improving sensitivity because the light collection loss in the zone region group 15 is lower.

Figure 18:
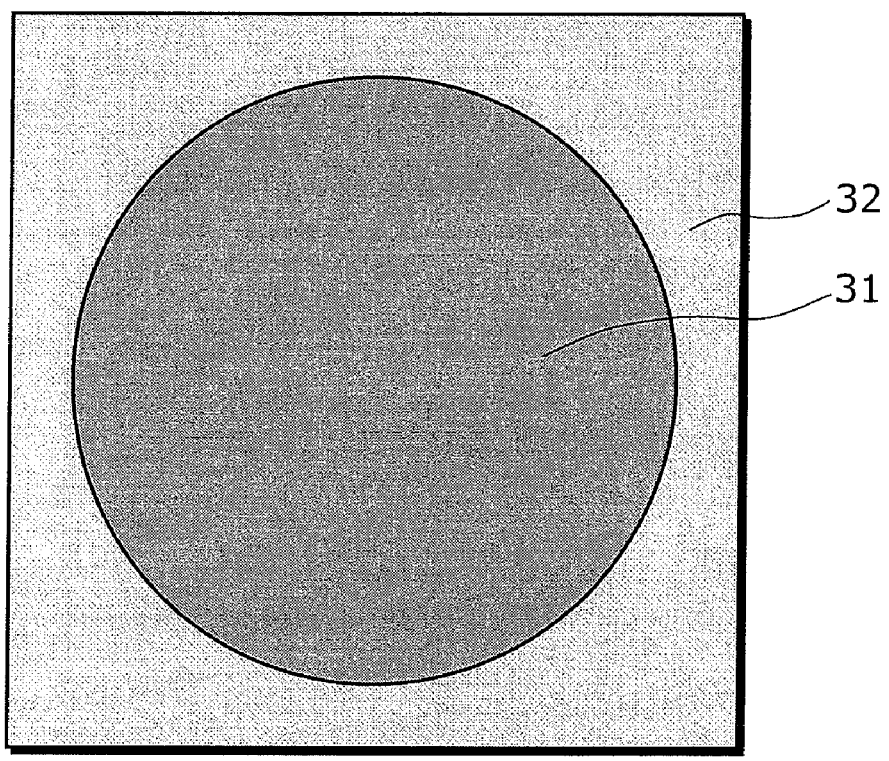
FIG. 18 is a diagram showing in section the structure of the distributed index lens in the third embodiment of the present invention.

FIG. 18 is a diagram showing a Fresnel zone layout (top view) in a unit pixel. With respect to 0° incident light, the pixel center and the lens optical center coincide with each other. A disk region 31, and a zone region group 32 (corresponding to the first Fresnel zone) are placed from the pixel center to the periphery. A feature of the layout according to this embodiment resides in that the distributed index lens is formed only of the first Fresnel zone when the incident angle is small (when the lens eccentricity is small). In this arrangement, no higher-order Fresnel zone appears and, therefore, the fine structure region which can act as a cause of occurrence of a light collection loss can be minimized, so that an improvement in light collection efficiency and an increase in sensitivity can be expected.

Fourth Embodiment

Figure 19:
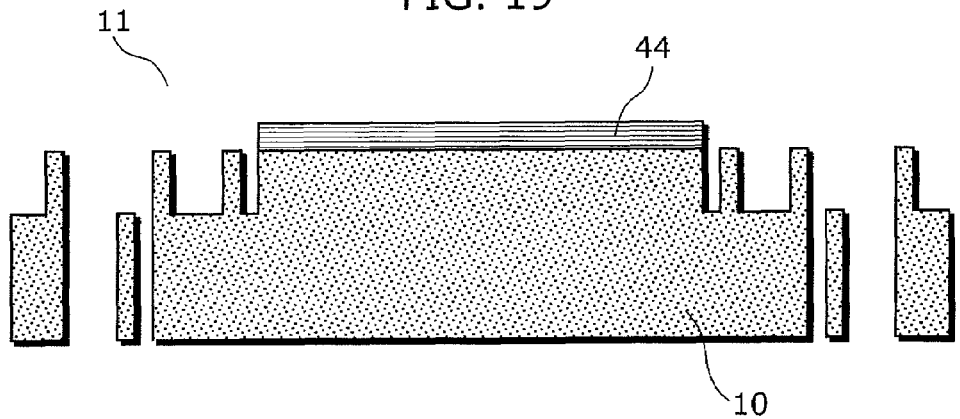
FIG. 19 is a diagram showing in section the structure of a lens having an antireflection film in a fourth embodiment of the present invention.

FIG. 19 is a diagram showing a distributed index lens having an antireflection film according to a fourth embodiment of the present invention. In the conventional SWLL, the surface has a fine projection/recess structure and, therefore, an antireflection film cannot be formed on the upper surface. In the distributed index lens according to this embodiment, the planer region is wide and an antireflection film can therefore be formed easily to reduce reflection of incident light on the lens surface.

In this embodiment, $SiO_2$ is used as a lens material. When SiN (n=2.0) or $TiO_2$ (n=2.51), which is a material of a higher refractive index is further used, the lens thickness can be reduced. In such a case, the aspect ratio of the structure is reduced and the process becomes easier to perform. However, when the refractive index of the lens material is increased, the reflectance at the surface also becomes higher and a problem arises that the light collection efficiency is reduced. An antireflection film is therefore provided on the planar portion to increase the amount of light taken in the lens and to thereby improve the light collection efficiency.

The antireflection film formed in this embodiment is a pair of $SiO_2$ and $TiO_2$ layers (total thickness: 300 nm), and the reflectivity at a wavelength of 0.45 to 0.65 μm is 0.5% or less.

Fifth Embodiment

Figure 20:
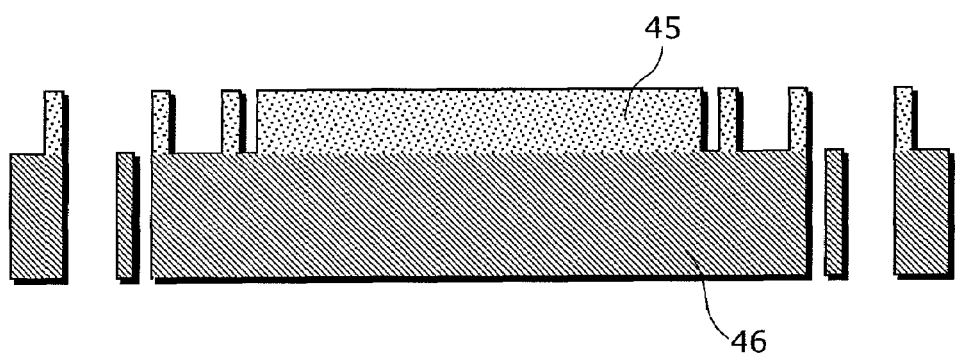
FIG. 20 is a diagram showing in section the structure of a lens having an antireflection film structure in a fifth embodiment of the present invention.

FIG. 20 is a diagram showing a distributed index lens having an antireflection function according to a fifth embodiment of the present invention. In a lens having a multistage structure and a wide planer region as in this embodiment, an antireflection film in which materials having different refractive indices are combined can be formed to have an antireflection function. According to this embodiment, a two-layer antireflection film was formed by using $SiO_2$ (n=1.43) as a low-refractive-index material and SiN (n=2.0) as a high-refractive-index material. Needless to say, a multilayer structure having a larger number of layers may be used. The reflectance is about 1% in the visible region. Further reducing the reflectance requires a construction in which the film thickness of each layer is set to ¼ wavelength. In this embodiment, however, the lens film thickness was set to such a value as to 2π-modulate the phase of incident light in order to maintain the light collection efficiency of the lens.

Sixth Embodiment

Figure 21:
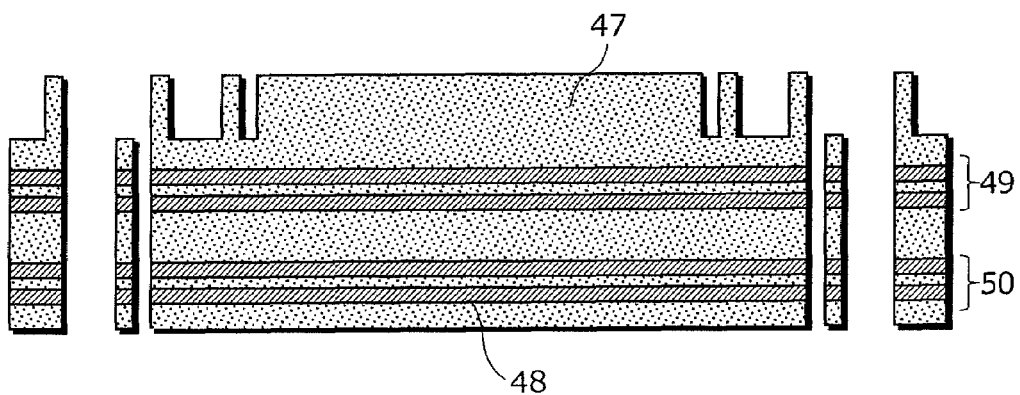
FIG. 21 is a diagram showing in section the structure of a lens having a color separating filter structure in a sixth embodiment of the present invention.

FIG. 21 shows a distributed index lens having a dielectric multilayer film structure having a color separating function according to the sixth embodiment of the present invention. An upper reflector 49 and a lower reflector 50 formed of a λ/4 film are opposed to each other symmetrically about spacer layer 48 to selectively form a transmission band region in a reflection band. Further, the transmission peak wavelength can be changed by changing the film thickness of the spacer layer 48. In this embodiment, a pair of $TiO_2$ (52 nm, n=2.51) and $SiO_2$ (91 nm, n=1.45) layers was used as the reflectors. The spacer layer film thicknesses with respect to colors were set to 30 nm (R), 0 nm (G) and 133 nm (B), respectively.

Thus, collection of light and color separation can be performed with a single element and the solid-state state imaging element can therefore be reduced in thickness. When the distance between the light collecting element and the light receiving element is reduced, oblique incident light can be introduced into the light receiving element more easily and a wide-angle solid-state imaging element can therefore be realized in which the sensitivity of peripheral pixels is not reduced.

Seventh Embodiment

Figure 9:
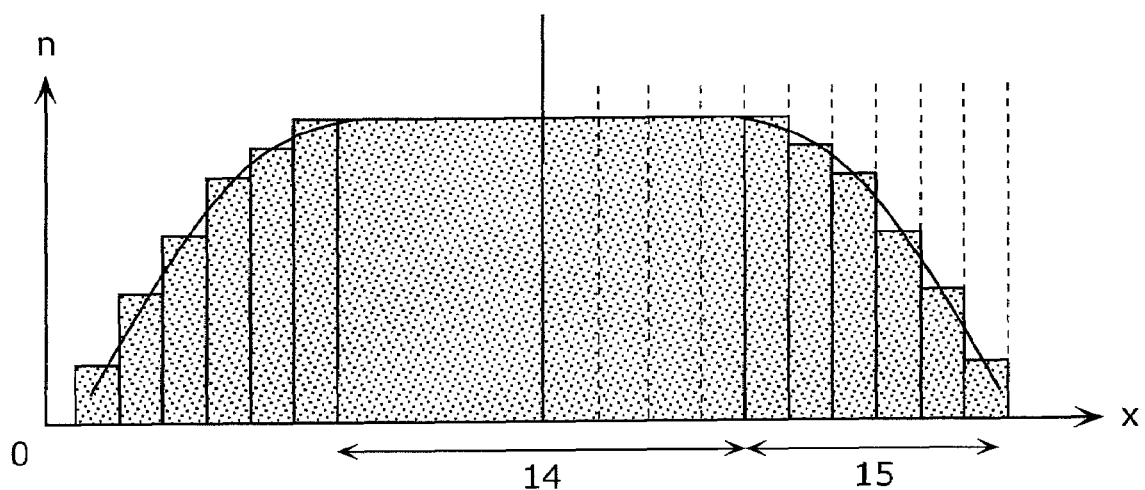
FIG. 9 is a diagram showing a refractive index distribution of the lens in the first embodiment of the present invention.
Figure 22:
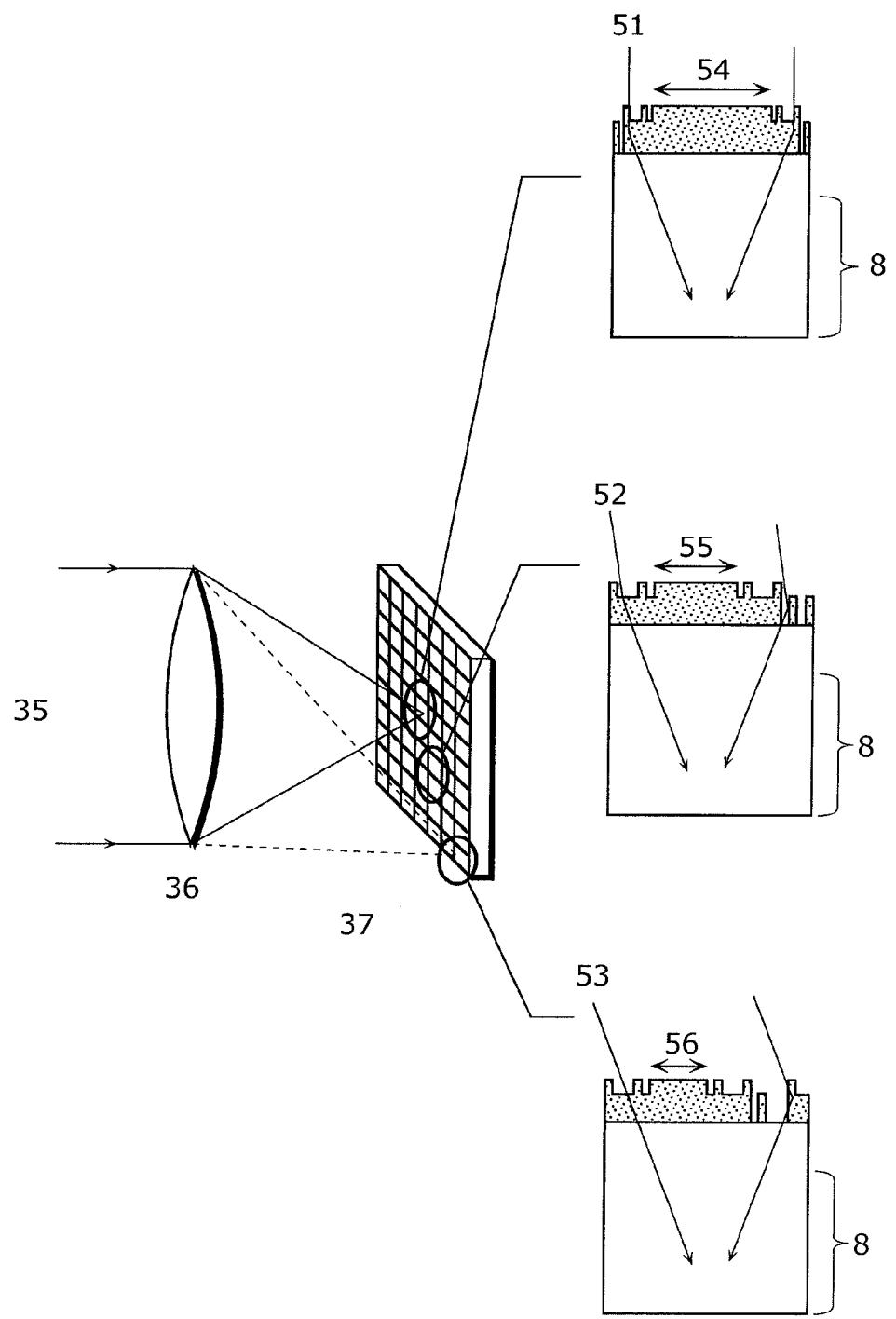
FIG. 22 is a diagram showing a basic structure of a pixel array in a seventh embodiment of the present invention.

FIG. 22 is a diagram showing a pixel array in a solid-state imaging element using VGA (310,000 pixels) according to a seventh embodiment of the present invention. Incident light 37 from the image taking lens 36 is incident on pixels about the center of the solid-state imaging element approximately at 0°, while the angle of incidence on the periphery is large. In this embodiment, distributed index lenses are made eccentric with the increase in incident angle and, in addition, the area of the planar region at the center of the lens is reduced (that is, a relationship: the diameter 54 of planar region>the diameter 55 of planar region>the diameter 56 of planar region is satisfied). That is, the planar region 14 in the refractive index distribution diagram of FIG. 9 is reduced and the zone region 15 is shifted toward the center of the solid-state imaging element. The rate of change in effective refractive index of the lens is thereby increased and the focal length is reduced (that is, the collected light spot becomes smaller). The effective aperture ratio of peripheral pixels is reduced in comparison with that of central pixels, so that the reduction in quantity of light caused by the light shielding films is increased. The focal length is then reduced with respect to the peripheral pixels to enable incident light to pass through the apertures of the light shielding films, thereby increasing the light collection sensitivity on the periphery.

Eighth Embodiment

Figure 23:
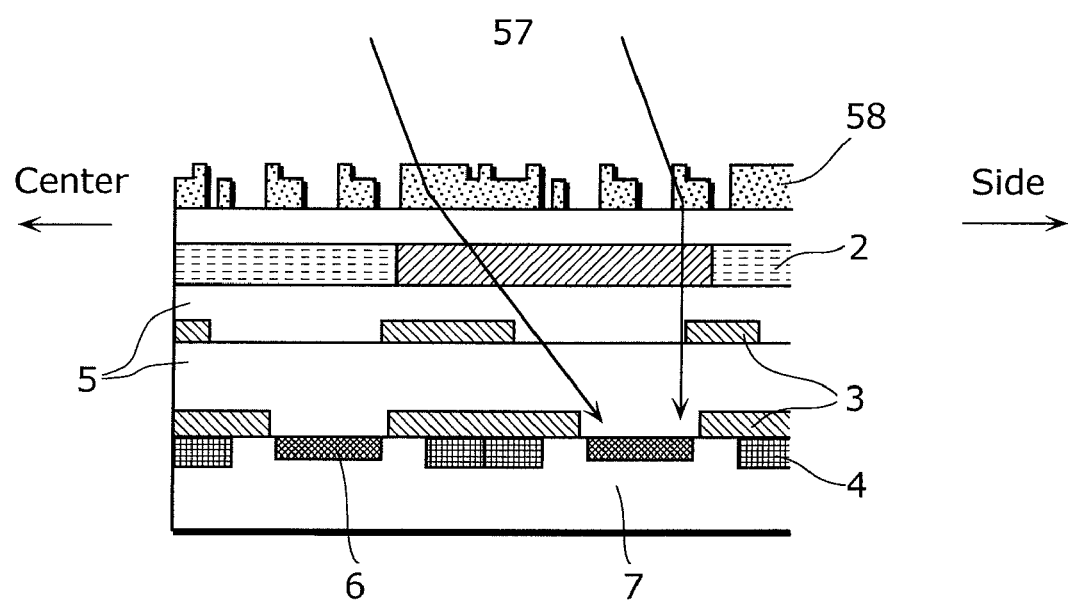
FIG. 23 is a diagram showing in section the structure of a solid-state imaging element in an eighth embodiment of the present invention.

FIG. 23 is a sectional view of a solid-state imaging element having a shrink structure and a lens mounted on the imaging element according to an eighth embodiment of the present invention. Light shielding film 3 is shrunk toward the center of the pixels to enable the eccentricity component of lenses 57 to be reduced. In this way, the quantity of light transmitted through the zone region group can be reduced, so that the sensitivity of peripheral pixels is increased. Needless to say, while the distributed index lens in this embodiment has an eccentric structure, a distributed index lens having a concentric structure (i.e., having no center position shift) may be shrunk.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The solid-state imaging element of the present invention is capable of improving the performance of image sensor products and reducing the price of the products. The image sensor products includes a digital video camera, a digital still camera, a mobile telephone with a camera, a monitor camera, a camera mounted on a vehicle and a broadcasting camera. Therefore, the solid-state imaging device is useful in the industry.

What is claimed is:

1. A solid-state imaging device, comprising:
    a plurality of unit pixels arranged in a two-dimensional array, each of the unit pixels comprising a light collecting element and a light receiving element,
    wherein each of the light collecting elements comprises:
        a plurality of zone regions of light transmitting films positioned in a concentric structure, which are divided by a line width substantially equal to or shorter than a wavelength of incident light; and
        a planar region positioned at a center of the concentric structure and having a diameter which is substantially equal to or larger than the wavelength of the incident light,
    wherein said planar region in said light collecting element has a constant refractive index produced by a light transmitting film which is uniformly formed, and
    each of said zone regions has an effective refractive index distribution produced by a light transmitting film which is partially formed.

2. The solid-state imaging device according to claim 1, wherein phase modulation caused by a refractive index distribution in said zone regions is divided by a product of $2\pi$ and a natural number except zero.

3. The solid-state imaging device according to claim 1, wherein a boundary corresponding to $2\pi$ of phase modulation caused by a refractive index distribution in said zone regions abuts on a single side or a plurality of sides of a pixel.

4. The solid-state imaging device according to claim 1, wherein a boundary corresponding to $2\pi$ of phase modulation caused by a refractive index distribution in said zone regions contains a pixel region.

5. The solid-state imaging device according to claim 1, wherein a position of a center of the concentric structure in said light collecting element differs from a position of a center of said solid-state imaging device.

6. The solid-state imaging device according to claim 1, wherein a multilayer film structure having an optical antireflection effect produced by a difference in refractive index is formed on said planar region of said light transmitting film.

7. The solid-state imaging device according to claim 1, wherein the structure of said light collecting device is a multilayer film structure having an optical antireflection effect produced by a difference in refractive index.

8. The solid-state imaging device according to claim 1, wherein the structure of said light collecting element is a dielectric multilayer film structure having a color separating function.

9. The solid-state imaging device according to claim 1, wherein said planar regions are formed with a transmitting film containing a refractive material, and
    said unit pixels which are positioned at a center of said solid-state imaging device are formed so that a center axis of each light receiving element and a center axis of the corresponding light collecting element coincide with each other, and said unit pixels which are positioned on a periphery of said solid-state imaging device are formed so that a center of each light collecting element is closer to a center of said solid-state imaging device than the corresponding light receiving element.

10. The solid-state imaging device according to claim 1, wherein said planar region of said light transmitting film in each light collecting element positioned on the periphery of said solid-state imaging device is smaller than said planar region of said light transmitting film in each light collecting element positioned at the center of said solid-state imaging device, and the number of said zone regions in said light collecting elements positioned on the periphery of said solid-state imaging device is larger than the number of said zone regions in said light collecting elements positioned at the center of said solid-state imaging device.

11. The solid-state imaging device according to claim 1, wherein a refractive index of said light collecting element is highest at the center of said light collecting element.

* * * * *